(12) United States Patent
Yim et al.

(10) Patent No.: US 11,901,240 B2
(45) Date of Patent: Feb. 13, 2024

(54) MULTI-FIN VERTICAL FIELD EFFECT TRANSISTOR AND SINGLE-FIN VERTICAL FIELD EFFECT TRANSISTOR ON A SINGLE INTEGRATED CIRCUIT CHIP

(71) Applicant: SAMSUNG ELECTRONICS CO., LTD., Suwon-si (KR)

(72) Inventors: Jeonghyuk Yim, Halfmoon, NY (US); Kang Ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 164 days.

(21) Appl. No.: 17/223,803

(22) Filed: Apr. 6, 2021

(65) Prior Publication Data

US 2022/0230924 A1    Jul. 21, 2022

Related U.S. Application Data

(60) Provisional application No. 63/138,598, filed on Jan. 18, 2021.

(51) Int. Cl.
| | |
|---|---|
| *H01L 21/8234* | (2006.01) |
| *H01L 27/088* | (2006.01) |
| *H01L 29/78* | (2006.01) |
| *H01L 21/3065* | (2006.01) |
| *H01L 21/308* | (2006.01) |
| *H01L 29/66* | (2006.01) |

(52) U.S. Cl.
CPC .... *H01L 21/823487* (2013.01); *H01L 21/308* (2013.01); *H01L 21/3065* (2013.01); *H01L 21/823412* (2013.01); *H01L 21/823437* (2013.01); *H01L 21/823481* (2013.01); *H01L 27/088* (2013.01); *H01L 29/66666* (2013.01); *H01L 29/7827* (2013.01)

(58) Field of Classification Search
CPC .......... H01L 27/2454; H01L 29/66666; H01L 29/78642; H01L 29/7827; H01L 29/7828; H01L 21/823885; H01L 21/823487; H01L 29/0676
See application file for complete search history.

(56) References Cited

U.S. PATENT DOCUMENTS

| | | | |
|---|---|---|---|
| 6,872,647 B1 * | 3/2005 | Yu | .......................... B82Y 10/00 438/587 |
| 7,947,589 B2 | 5/2011 | Muralidhar et al. | |
| 8,703,557 B1 | 4/2014 | Cai et al. | |
| 9,219,133 B2 | 12/2015 | Loubet et al. | |

(Continued)

OTHER PUBLICATIONS

Communication dated May 27, 2022 by the European Patent Office for European Patent Application No. 21212747.6.

*Primary Examiner* — John A Bodnar
(74) *Attorney, Agent, or Firm* — Sughrue Mion, PLLC

(57) ABSTRACT

Provided is a vertical field-effect transistor (VFET) device which includes: a substrate; a plurality of single-fin VFETs including respective $1^{st}$ fin structures on the substrate; and a plurality of multi-fin VFETs each of which includes a plurality of $2^{nd}$ fin structures on the substrate, wherein a fin pitch of the $2^{nd}$ fin structures is smaller than a fin pitch of the $1^{st}$ fin structures.

7 Claims, 9 Drawing Sheets

(56) References Cited

U.S. PATENT DOCUMENTS

| | | |
|---|---|---|
| 9,263,287 B2 | 2/2016 | Tsao et al. |
| 9,768,072 B1 * | 9/2017 | Cheng ............... H01L 21/76232 |
| 9,793,408 B2 | 10/2017 | Doornbos et al. |
| 2004/0108545 A1 * | 6/2004 | Ando .................. H01L 27/0924 |
| | | 257/E21.345 |
| 2010/0181615 A1 | 7/2010 | Ikebuchi |
| 2017/0301666 A1 * | 10/2017 | Anderson ....... H01L 21/823487 |
| 2017/0358660 A1 * | 12/2017 | Cheng ............... H01L 21/02129 |
| 2018/0053767 A1 | 2/2018 | Cheng et al. |
| 2018/0122936 A1 | 5/2018 | Cheng et al. |
| 2018/0211866 A1 * | 7/2018 | Cheng .................... H01L 22/26 |
| 2019/0131179 A1 | 5/2019 | Cheng |

\* cited by examiner

MULTI-FIN VERTICAL FIELD EFFECT TRANSISTOR AND SINGLE-FIN VERTICAL FIELD EFFECT TRANSISTOR ON A SINGLE INTEGRATED CIRCUIT CHIP

CROSS-REFERENCE TO THE RELATED APPLICATION

This application claims priority from U.S. Provisional Application No. 63/138,598 filed on Jan. 18, 2021 in the U.S. Patent and Trademark Office, the disclosure of which is incorporated herein in its entirety by reference.

BACKGROUND

1. Field

Apparatuses and methods consistent with example embodiments of the inventive concept relate to a structure for a multi-fin vertical field-effect transistor (VFET) and a single-fin VFET formed on single wafer.

2. Description of the Related Art

In a VFET, a current flows through a channel formed at a fin structure protruded from a substrate in a vertical direction unlike the related art planar FET or fin field-effect transistor (finFET). The vertically protruded fin structure is wrapped or surrounded by a gate structure, and a bottom source/drain region and a top source/drain region are formed around at a bottom portion and a top portion of the fin structure, respectively.

The VFET is known as a zero-diffusion break device, so that one or more dummy gates may not be required to isolate a VFET from a neighboring VFET while such dummy gates are required for isolation of planar FETs or finFETs from one another. Still, however, an isolation structure such as an interlayer dielectric (ILD) may be necessary to isolate two neighboring VFETs from each other. Thus, it is difficult to achieve increasing device density of VFETs by reducing a fin pitch because of the ILD. This is particularly so when an improved device performance of VFETs is required.

SUMMARY

Various embodiments of the inventive concept provide a VFET device including a plurality of single-fin VFETs and a plurality of multi-fin VFETs on a single integrated circuit (IC) chip and methods for manufacturing the same.

According to an example embodiment, there is provided a VFET device which may include: a substrate; at least one single-fin VFET formed on the substrate, and each of the at least one single-fin VFET comprising a fin structure and a gate structure surrounding the fin structure; at least one multi-fin VFET formed on the same substrate, each of the at least one multi-fin VFET including a plurality of fin structures and a connected gate structure surrounding the plurality fin structures; and an isolation structure between a single-fin VFET and a neighboring multi-fin VFET to electrically disconnect the gate structure of the single-fin VFET and the connected gate structure of the neighboring multi-fin VFET, wherein the connected gate structure is formed in a space between the neighboring two fin structures.

According to an example embodiment, the at least one multi-fin VFET may include a plurality of multi-fin VFETs, and no isolation structure may be formed between neighboring two fin structures of the multi-fin VFET to electrically disconnect the connected gate structure surrounding the neighboring two fin structures.

According to an example embodiment, there is provided a VFET device which may include: a substrate; a plurality of single-fin VFETs including respective $1^{st}$ fin structures on the substrate; and a plurality of multi-fin VFETs each of which includes a plurality of $2^{nd}$ fin structures on the substrate, wherein a fin pitch of the $2^{nd}$ fin structures is smaller than a fin pitch of the $1^{st}$ fin structures.

According to an example embodiment, there is provided a method of forming a VFET device. The method may include: providing an substrate; determining a number and positions of mask structures to be used to form $1^{st}$ fin structures for a plurality of single-fin VFETs and $2^{nd}$ fin structures for each of a plurality of multi-fin VFETs above the substrate; depositing the mask structures above the substrate according to the determined number and positions; applying lithography patterning using the mask structures to the substrate to form the $1^{st}$ fin structures and form the $2^{nd}$ fin structures on the substrate; forming gate structures surrounding the $1^{st}$ fin structures, respectively, and forming a connected gate structure surrounding the $2^{nd}$ fin structures for each of the multi-fin VFETs; and forming an isolation structure to electrically disconnect neighboring two single-fin VFETs and electrically disconnect neighboring two multi-fin VFETs, wherein no isolation structure is formed between neighboring two $2^{nd}$ fin structures for a multi-fin VFET to electrically disconnect the connected gate structure surrounding the neighboring two $2^{nd}$ fin structures.

BRIEF DESCRIPTION OF THE DRAWINGS

The above and other aspects of inventive concepts will become more apparent to those of ordinary skill in the art by describing in detail example embodiments thereof with reference to the accompanying drawings, in which.

DETAILED DESCRIPTION OF THE EMBODIMENTS

Figure 1A:
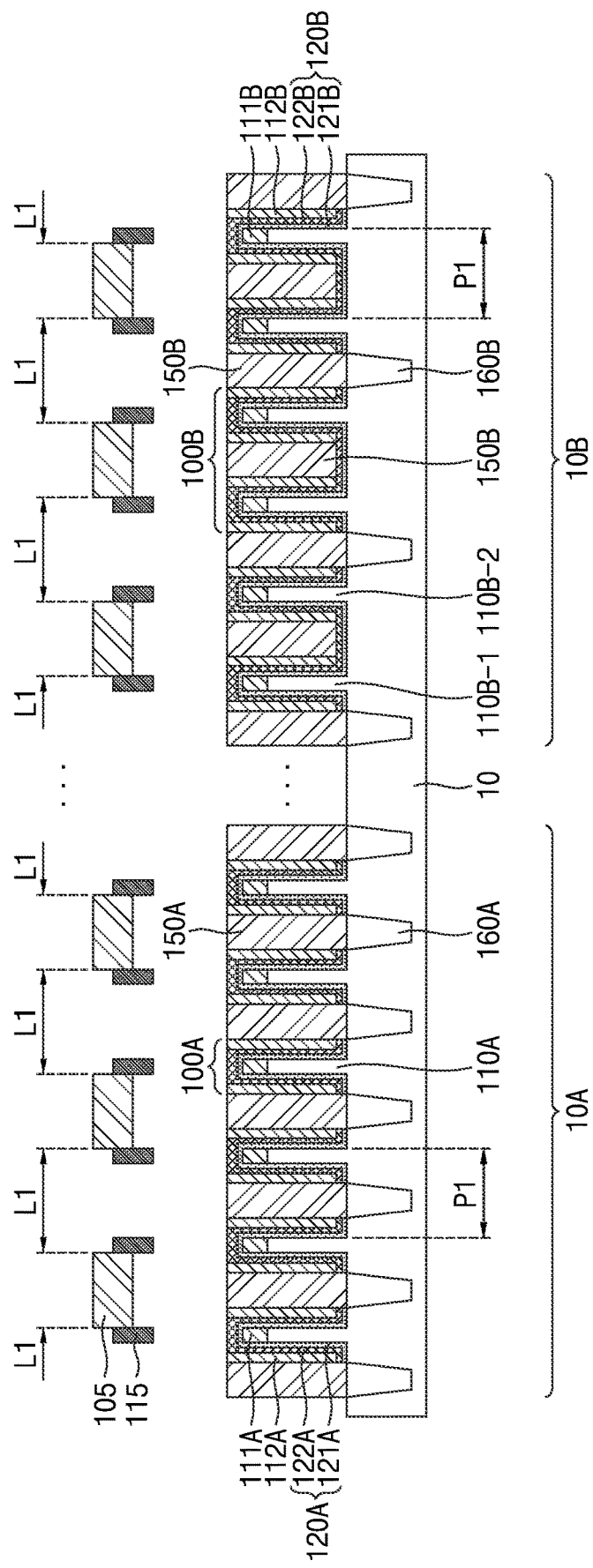
FIG. 1A illustrates a cross-section view of an intermediate structure of a VFET device which includes a plurality of single-fin VFET structures and a plurality of two-fin VFET structures formed on a substrate, according to an embodiment.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation of manufacturing an inventive apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to semiconductor devices including VFETs may or may not be described in detail herein. In the drawings, the reference numbers indicating the same elements in different drawings may be omitted in one or more of the drawings for brevity. For example, some of the reference numbers shown in FIG. 1A are not shown in FIG. 1B when they indicate the same elements in both FIGS. 1A and 1B.

FIG. 1A illustrates a cross-section view of an intermediate structure of a VFET device which includes a plurality of single-fin VFET structures and a plurality of two-fin VFET structures formed on a substrate, according to an embodiment.

Referring to FIG. 1A, a plurality of single-fin VFET structures 100A and a plurality of two-fin VFET structures 100B are provided on a substrate 10 of a single integrated circuit (IC) chip. Here, the single-fin VFET represents a VFET formed of one fin structure as a channel of the VFET, and the two-fin VFET represents a VFET formed of two fin structures as a combined channel of the VFET. In FIG. 1A, six single-fin VFET structures 100A are formed on a $1^{st}$ area 10A of the substrate 10, and three two-fin VFET structures 100B are formed on a $2^{nd}$ area 10B of the substrate 10.

Although FIG. 1A shows that the $1^{st}$ area 10A and the $2^{nd}$ area 10B of the substrate 10 respectively include only six single-fin VFET structures and three two-fin VFET structures, more or less number of single-fin VFET structures and two-fin VFET structures may be formed on the $1^{st}$ area 10A and the $2^{nd}$ area 10B, respectively, according to embodiments. The substrate 10 may also include other areas where one or more single-fin VFET structures and/or one or more two-fin VFET structures are formed. The substrate 10 may be a bulk substrate of a semiconductor material, for example, silicon (Si) or a silicon-on-insulator (SOI) substrate.

The single-fin VFET structure 100A includes a fin structure 110A which is patterned from the substrate 10 in its initial state to become a channel of the single-fin VFET structure 100A. A gate structure 120A may be conformally formed on a sidewall of the fin structure 110A to surround the fin structure 110A. The gate structure 120A may include a gate dielectric layer 121A and a conductor layer 122A. The gate dielectric layer 121A may include at least an interfacial layer formed on the sidewall of the fin structure 110A and a high-κ dielectric layer formed on the interfacial layer. Further, the gate structure 120A may be encapsulated by an encapsulation layer 112A formed of silicon nitride (SiN) or its equivalent. Above the fin structure 110A is a mask layer 111A used to protect the fin structure 110A in an etching process applied to the initial state of the substrate 10 before the fin structure 110A is formed, which is referred to as an "initial substrate" herebelow.

The interfacial layer may include at least one of silicon oxide (SiO), silicon dioxide ($SiO_2$), and/or silicon oxynitride (SiON), not being limited thereto to protect the fin structure 110, facilitate growth of the high-κ dielectric layer thereon, and provide a necessary characteristic interface with the fin structure 110A. The high-κ dielectric layer may be formed of a metal oxide material or a metal silicate such as Hf, Al, Zr, La, Mg, Ba, Ti, Pb, or a combination thereof, not being limited thereto, having a dielectric constant value greater than 7. The high-κ dielectric layer may be provided to allow an increased gate capacitance without associated current leakage at the gate structure 120A in the single-fin VFET 100A. The conductor layer 122A, which is also referred to as a work function metal (WFM) layer, may include a metal or metal compound such as Cu, Al, Ti, Ta, W, Co, TiN, WN, TiAl, TiAlN, TaN, TiC, TaC, TiAlC, TaCN, TaSiN, and/or a combination thereof, not being limited thereto.

As described above, the $1^{st}$ area 10A of the substrate 10 includes six single-fin VFET structures 100A arranged in a row, and each of the single-fin VFET structures 100A is formed of the fin structure 110. The six single-fin VFET structures 100A may be electrically isolated from one another by an ILD 150A and a shallow trench isolation (STI) 160A. The ILD 150A and the STI 160A may each include SiO or its equivalent material.

The fin structures 110A may be formed by self-aligned double patterning (SADP) of the initial substrate, using a plurality of mask structures such as mandrels and spacers, according to an embodiment. The SADP used herein may be Argon-Fluoride immersion (ArF-i) SADP. However, it is understood that the fin structures 110A may also be formed by different lithography patterning methods such as self-aligned quadruple patterning (SAQP) or single-exposure patterning, not being limited thereto.

In FIG. 1A, three sets of one mandrel 105 and two spacers 115 are shown above the six single-fin VFET structures 100A and another three sets of one mandrel 105 and two spacers 115 are shown above the three two-fin VFET structures 100B. Here, FIG. 1A shows where the mandrels 105 and the spacers 115 are positioned with respect to the fin structures of the single-fin VFET structures 100A in the $1^{st}$ area 10A of the substrate 10 during manufacturing of the intermediate structure of the VFET device, and how each fin structure thereof is patterned through the SADP using these mandrels and spacers to obtain each fin structure. The mandrels 105 and the spacers 115 as well as the mask layer 111A would be removed after patterning out the fin structures for the single-fin VFET structures 100A in the $1^{st}$ area 10A of the substrate 10.

In order to pattern the six fin structures 110A of the six single-fin VFET structures 100A from the initial substrate through the SADP, the three mandrels 105 may be formed in a row above the initial substrate with a predetermined interval L1 therebetween, and two spacers 115 may be deposited on sidewalls of each mandrel 105 at positions where two neighboring fin structures 110A are to be formed therebelow, respectively. The mandrels 105 may be removed by, for example, dry etching, leaving only the spacers 115 above the initial substrate, which may be etched using the spacers 115 as a mask to pattern out the six fin structures 110A. Since the spacer 115 is used as a mask to pattern the fin structure 110A therebelow, a width of the spacer 115 may be the same as a width of the fin structure 110A patterned therebelow.

The mandrels 105 may be formed of a spin-on-hard mask (SOH) material including a silicon-based organic material, not being limited thereto. A variety of different amorphous silicon materials may be used to form the mandrels 105 as long as the mandrels 105 have etch selectivity with respect to the spacers 115 to be formed on sidewalls, i.e., side surfaces, of the mandrels 105. The spacer 115 may be formed by depositing a spacer material such as SiO on the sidewalls the mandrels 105. The process of depositing the spacer material may be performed by a thin film deposition technique such as atomic layer deposition (ALD), not being limited thereto. The initial substrate may be etched by anisotropic etching or plasma etching, not being limited thereto, to pattern the fin structure 110A using the spacer 115 as a mask. The spacer material forming the spacer 115 may also not be limited to SiO as long as the spacer material has etching selectivity with respect to the material forming the mandrels 105.

In contrast with the $1^{st}$ area 10A of the substrate 10, the $2^{nd}$ area 10B of the substrate 10 includes three two-fin VFET structures 100B arranged in a row, and each of the two-fin VFET structures 100B is formed of two fin structures 110B-1 and 110B-2 surrounded by a connected gate structure 120B. Like the gate structure 120A in the $1^{st}$ area 10A, the connected gate structure 120B includes a gate dielectric layer 121B and a conductor layer 122B, and may be encapsulated by an encapsulation layer 112B formed of SiN or its equivalent. Above each of the fin structures 110B-1 and 110B-2 is a mask layer 111B used to protect the fin structure in an etching process applied to the initial substrate.

Two neighboring two-fin VFET structures 100B may be electrically isolated (or disconnected) by an ILD 150B and an STI 160B. The ILD 150B may also be formed between the two fin structures 110B-1 and 110B-2 within a two-fin VFET structure 100B like between the two fin structures 110A in the $1^{st}$ area 10A. The ILD 150B and the STI 160B may each include SiO or its equivalent material like the ILD 150A and the STI 160A in the $1^{st}$ area 10A of the substrate 10, respectively. However, the STI 160B is not formed below the ILD 150B between the two fin structures 110B-1 and 110B-2, while the STI 160B is formed below the ILD 150B isolating two neighboring two-fin VFET structures 100B.

Each of the fin structures 110B-1 and 110B-2 may have the same structure and include materials as the fin structure 110A of the single-fin VFET 100A. Thus, the descriptions thereof are omitted herein.

The fin structures 110B-1 and 110B-2 may also be patterned by the same process, that is, the SADP described above, using the same mandrels 105 and spacers 115 used to pattern the fin structures 110A of the single-fin VFET 100A. For example, the same number of mandrels 105 and spacers 115 may be disposed above the initial substrate such that six spacers 115 are respectively formed on the sidewalls of three mandrels 105 at the positions corresponding to the six fin structures of the three two-fin VFET structures 100B, i.e., three sets of fin structures 110B-1 and 110B-2, to pattern the three two-fin VFET structures 100B. It is noted here that the SADP of the six fin structures 110A from the $1^{st}$ area 10A of the initial substrate and the SADP of the three sets of the fin structures 110B-1 and 110B-2 from the $2^{nd}$ area 10B of the initial substrate may be one same SADP performed at the same time using the six sets of one mandrel 105 and two spacers 115.

After the fin structures 110A, 110B-1 and 110B-2 are formed on the substrate 10 in the above manner, source/drain regions may be formed above and below of these fin structures to complete a VFET device on a single IC chip.

Figure 1B:
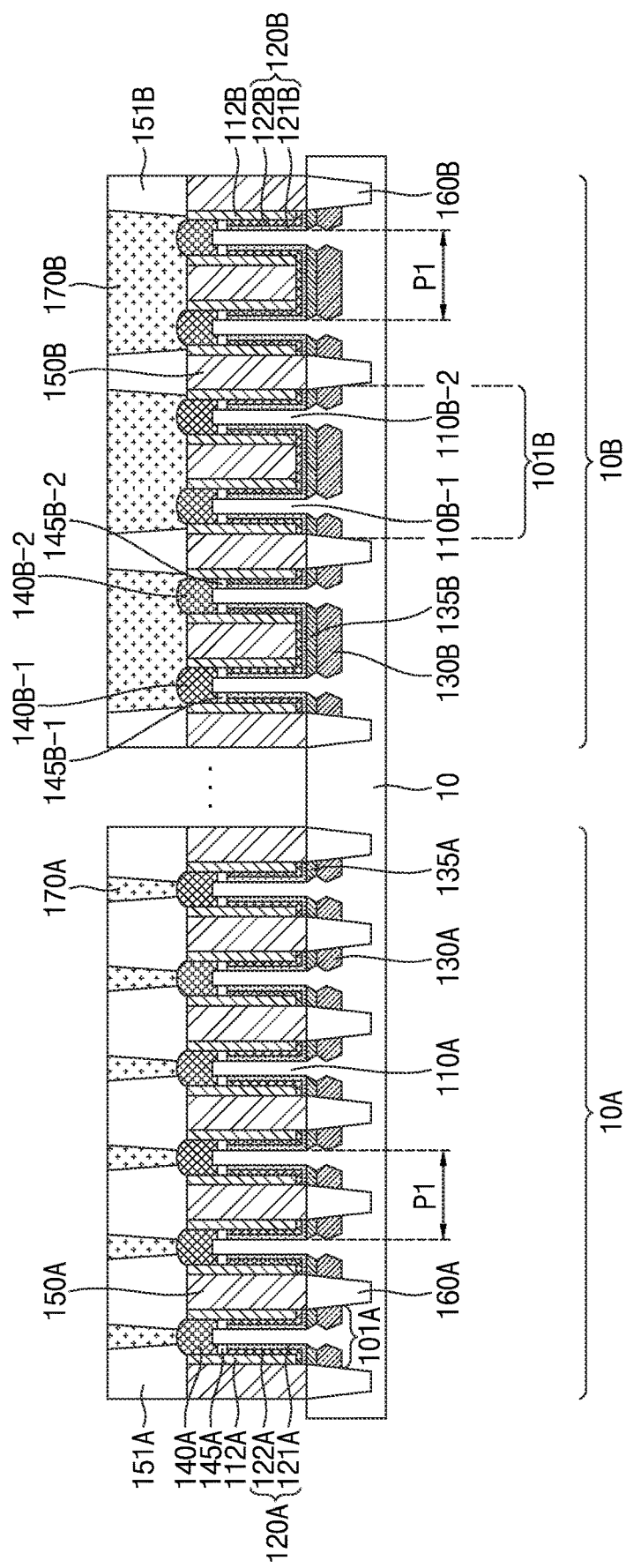
FIG. 1B illustrates a cross-section view of a structure of a VFET device in which an intermediate structure of the VFET device of FIG. 1A is completed on a substrate, according to an embodiment.

FIG. 1B illustrates a cross-section view of a structure of a VFET device in which an intermediate structure of the VFET device of FIG. 1A is completed on a substrate, according to an embodiment. For drawing brevity, some of the reference numbers used in FIG. 1A are not shown in FIG. 1B when they indicate same elements in both FIGS. 1A and 1B.

Referring to FIG. 1B, a bottom source/drain region 130A and a top source/drain region 140A are formed below and above the gate structure 120A of each single-fin VFET structure 100A in the $1^{st}$ area 10A of the substrate 10, thereby to form each single-fin VFET 101A. The bottom source/drain region 130A may be epitaxially grown from the substrate 10 to be doped with one or more dopants such as boron (B) for a p-channel VFET and phosphorous (P) for a n-channel VFET, not being limited thereto. The top source/drain region 140A may be epitaxially grown from each fin structure 110A to be doped with the same one or more dopants in the bottom source/drain region 130A. On the top source/drain region 140A is disposed a top source/drain region contact structure (CA) 170A to connect the single-fin VFET 101A to a power source or another circuit element for internal routing. The top source/drain region contact structures 170A of the single-fin VFETs 101A are isolated from one another by an additional ILD 151A which may be formed of the same or similar material of the ILD 150A.

FIG. 1B further shows that a bottom spacer 135A is formed between the gate structure 120A and the bottom source/drain region 130A for insulation thereof, and a top spacer 145A is formed between the gate structure 120A and the top source/drain region 140A for insulation thereof. The bottom spacer 135A and the top spacer 145A may be formed of a material of at least one of SiO, SiN, and any low-K materials such as SiCOH or SiBCN, not being limited thereto.

In contrast, a plurality of two-fin VFETs 101B are formed in the $2^{nd}$ area 10B of the substrate 10 by forming differently-structured bottom source/drain regions and top source/drain regions below and above the two-fin VFET structures 100B, respectively, as shown in FIG. 1B.

Each of the two-fin VFETs 101B includes a common bottom source/drain region 130B and a common bottom spacer 135B corresponding to the two fin structures 110B-1 and 110B-2, and top source/drain regions 140B-1 and 140B-2 and top spacers 145B-1 and 145B-2 respectively corresponding to the two fin structures 110B-1 and 110B-2. However, within each of the two-fin VFETs 101B, the top source/drain region 140B-1 and 140B-2 are connected to each other by a common top source/drain region contact structure (CA) 170B to connect the two-fin VFET 101B to a power source or another circuit element for internal routing. The common top source/drain region contact structures 170B of the multi-fin VFETs 101B are isolated from one another by an additional ILD 151B which may be formed of the same or similar material of the ILD 150A. The bottom source/drain region 130B, the bottom spacer 135B, the top source/drain regions 140B-1 and 140B-2 and the top spacers 145B-1 and 145B-2 may be formed of the same materials of the source/drain region 130A, the bottom spacer 135A, the top source/drain region 140A and the top spacer 145A in the $1^{st}$ area 10A of the substrate 10, and thus, duplicate descriptions are omitted herein.

It is understood that when a VFET is formed of two or more fin structures, a drive current of the VFET can increase to improve the performance of the VFET because gate structures surrounding the fin structures are connected to each other. Thus, the two-fin VFET 101B formed of the two fin structures 110B-1 and 110B-2 may be superior to the single-fin VFET 101A formed of the one fin structure 110A in terms of device performance because the connected gate structure 120B surrounding the two fin structures 110B-1 and 110B-2, respectively, are connected to each other as shown in FIGS. 1A and 1B. In addition, the two fin structures 110B-1 and 110B-2 forming the two-fin VFET 101B are not isolated from each other by an STI structure, a manufacturing process of the VFET device may be simplified.

Meanwhile, it is noted that both the single-fin VFETs 101A and the two-fin VFETs 101B may be formed in a single IC chip by applying the SADP at the same time to save manufacturing costs. In other words, the fin structures of the single-fin VFETs 101A and the two-fin VFETs 101B are formed not using different patterning methods, for example, single exposure patterning and SADP, respectively, at different times.

However, the two-fin VFETs 101B have the same fin pitch P1 as the single-fin VFETs 101A as shown in FIGS. 1A and 1B, thereby do not achieve a device area gain. Further, the ILD 150B may not be necessary between the two fin structures 110B-1 and 110B-2 because the connected gate structure 120B needs not to be electrically isolated.

Thus, an embodiment addressing these aspects of the VFET device shown in FIGS. 1A and 1B is provided herebelow.

Figure 2A:
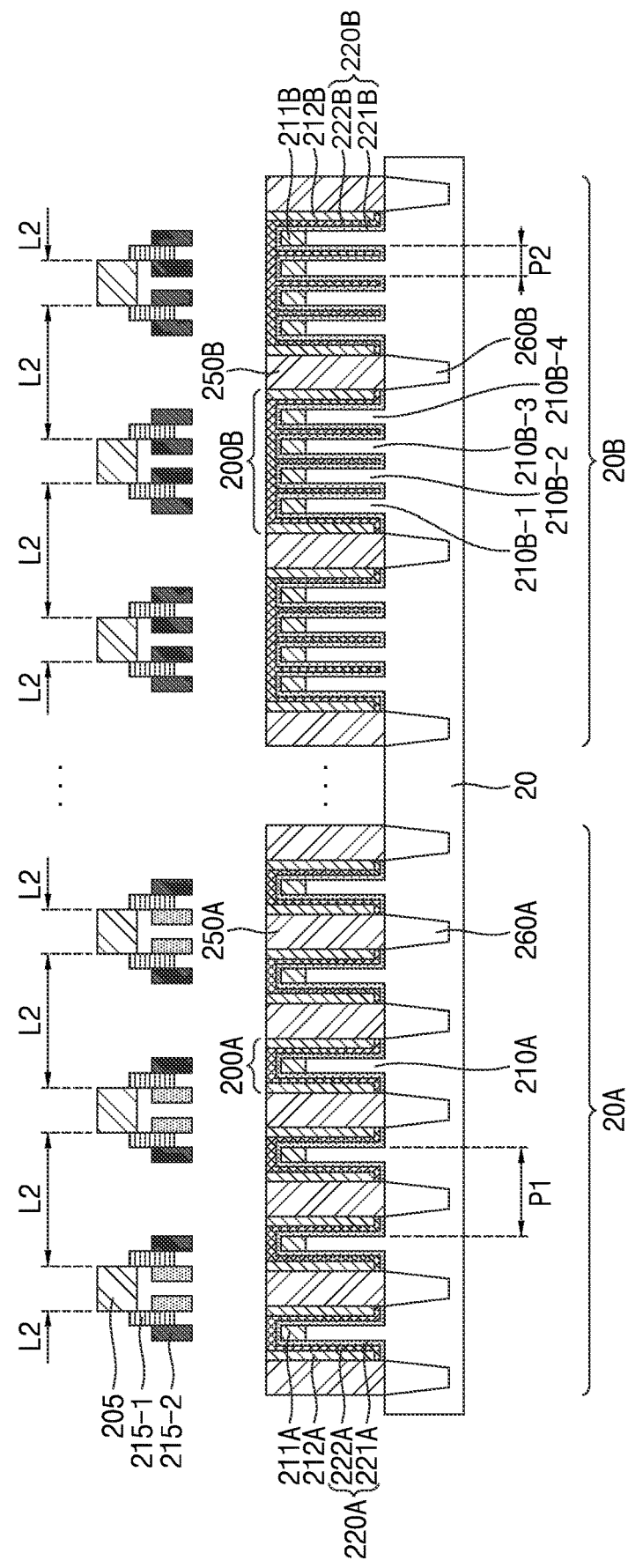
FIG. 2A illustrates a cross-section view of an intermediate structure of a VFET device which includes a plurality of single-fin VFET structures and a plurality of four-fin VFET structures are formed on a substrate, according to an embodiment.

FIG. 2A illustrates a cross-section view of an intermediate structure of a VFET device which includes a plurality of single-fin VFET structures and a plurality of four-fin VFET structures are formed on a substrate, according to an embodiment.

Referring to FIG. 2A, a plurality of single-fin VFET structures 200A and a plurality of four-fin VFET structures 200B are provided on a substrate 20 of a single IC chip. Here, the four-fin VFET represents a VFET formed of four fin structures as a combined channel of the VFET. In FIG. 2A, six single-fin VFET structures 200A are formed on a $1^{st}$ area 20A of the substrate 20, and three four-fin VFET structures 200B are formed on a $2^{nd}$ area 20B of the substrate 20. Although FIG. 2A shows that the $1^{st}$ area 20A and the $2^{nd}$ area 20B respectively include only six single-fin VFET structures and three four-fin VFET structures, more or less number of single-fin VFET structures and four-fin VFET structures may be formed on the $1^{st}$ area 20A and the $2^{nd}$ area 20B, respectively, according to embodiments. The substrate 20 may also include other areas where one or more single-fin VFET structures and/or one or more four-fin VFET structures are formed. Like the substrate 10 of FIG. 1A, the substrate 20 may also be a bulk substrate of a semiconductor material, for example, Si or an SOI substrate.

The single-fin VFET structure 200A may be the same as the single-fin VFET structure 100A of FIG. 1A in terms of functions, structure and materials forming thereof, and thus, descriptions thereof are omitted herein. Thus, a fin structure 210A and a gate structure 220A including a gate dielectric layer 221A and a conductor layer 222A may also be the same as the fin structure 110A and the gate structure 120A including the gate dielectric layer 121A and the conductor layer 122A, respectively. Above each fin structure 210A is disposed a mask layer 211A used to protect the fin structure 210A in an etching process applied to the substrate 20 in its initial state. The gate structure 220A may be encapsulated by an encapsulation layer 212A formed of SiN or its equivalent.

Further, the six single-fin VFET structures 200A may be electrically isolated by an ILD 250A and an STI 260A which may be the same as the ILD 150A and the STI 160A in terms of functions, structure and materials forming thereof.

However, a method of forming the six single-fin VFET structures 200A in the $1^{st}$ area 20A of the substrate 20 may be different from that of forming the single-fin VFET structures 100A in the $1^{st}$ area 10A of the substrate 10 shown in FIG. 1A.

While the six fin structures 110A of the six single-fin VFET structures 100A shown in FIG. 1A may be formed by applying SADP on the initial substrate using the three mandrels 105 and the six spacers 115, the six fin structure 210A of the six single-fin VFET structures 200A shown in FIG. 2A may be formed by applying SAQP on an initial substrate, which is an initial state of the substrate 20 before the fin structure 210A is formed, using three sets of a mandrel 205, two $1^{st}$ spacers 215-1 and four $2^{nd}$ spacers 215-2, that is a total of three mandrels 205, six $1^{st}$ spacers 215-1 and twelve $2^{nd}$ spacers 215-2. The SAQP used herein may be ArF-i SAQP according to an embodiment.

FIG. 2A shows where the mandrels 205 and the spacers 215-1 and 215-2 are disposed above the VFET structures 200A and 200B with respect to the fin structures to be formed therebelow to illustrate how each of these fin structures is patterned through the SAQP using these mask structures. All of the mandrels 205 and the spacers 215-1 and 215-2 as well as the mask layer 211A would also be removed after patterning the fin structures of the VFET structures 200A and 200B like the mandrels 105, the spacers 115 and the mask layer 111A of FIG. 1A.

In order to pattern the six fin structures 210A from the initial substrate through the SAQP, three mandrels 205 may be formed in a row above the initial substrate with a predetermined interval L2 therebetween, and two $1^{st}$ spacers 215-1 may be deposited on sidewalls of each mandrel 205. The mandrels 205 may be removed by, for example, dry etching, leaving only the $1^{st}$ spacers 215-1 above the initial substrate. Two $2^{nd}$ spacers 215-2 may be deposited on sidewalls of each of the $1^{st}$ spacers 215-1, and the $1^{st}$ spacers 215-1 may be removed by the same or similar method of removing the mandrels 205. Thus, FIG. 2A shows that a total of twelve $2^{nd}$ spacers 215-2 are deposited above the substrate 20 at the $1^{st}$ area 20A.

The initial substrate may be etched using the twelve $2^{nd}$ spacers 215-2 as respective masks to form twelve fin structures therebelow, and six $2^{nd}$ spacers 215-2, except selected six $2^{nd}$ spacers 215-2 below which the six fin structures 210A are to be formed, are removed to etch out six fin structures formed therebelow leaving only the six fin structures 210A in the $1^{st}$ area 20A of the substrate 20 as shown in FIG. 2A. Alternatively, the initial substrate may be etched by first removing the non-selected six $2^{nd}$ spacers 215-2, and then using the selected six $2^{nd}$ spacers 215-2 as respective masks to pattern the six fin structures 210A. Below the removed six $2^{nd}$ spacers 215-2 in the $1^{st}$ area 20A, the ILDs 250A may be formed. In the present embodiment, the mandrels 205, the $1^{st}$ spacers 215-1 and the $2^{nd}$ spacers 215-2 for the SAQP may be arranged above the $1^{st}$ area 20A of the initial substrate such that the selected $2^{nd}$ spacers 215-2 are disposed at positions where the fin structures 210A for the single-fin VFET structures 200A are to be formed therebelow, respectively. Since the $2^{nd}$ spacer 215-2 is used as a mask to pattern the fin structure 210A therebelow, a width of the $2^{nd}$ spacer 215-2 may be the same as a width of the fin structure 210A.

It is noted here that the fin structures 210A of the single-fin VFET structures 200A are patterned by the SAQP using a plurality of sets of one mandrel 205, two $1^{st}$ spacers 215-1 and four $2^{nd}$ spacers 215-2 with the predetermined interval L2, while the fin structures 110A of the single-fin VFET structures 100A, which are the same as the fin structures 210A, are patterned by the SADP using only a plurality of sets of one mandrel 105 and two spacers 115 as shown in FIG. 1A. In other words, the fin structures 210A of the single-fin VFET structures 200A are formed by applying SAQP which uses more spacers than SADP to form the fin structures 110A of the single-fin VFET structures 100A. One reason for nevertheless using the SAQP to pattern the fin structures 210A of the single-fin VFET structures 200A is that fin structures of the four-fin VFET structures 200B will also be patterned using the SAQP on the same substrate 20, where the fin structures 210A of the single-fin VFET structures 200A are formed, to form a single IC chip. It is noted that applying SAQP to formation of fin structures of single-fin VFET structures as well as fin structures of multi-fin VFET structures on the same substrate 20 at a same time costs less than applying SADP to formation of the fin structures of the single-fin VFETs and applying SAQP to formation of the fin structure of the multi-fin VFET structures on the same substrate 20 at different times.

The mandrels 205 and the spacers 215-1 and 215-2 may include the same materials forming the mandrels 105 and the spacers 115, and thus, descriptions thereof are omitted herein.

In contrast with the $1^{st}$ area 20A of the substrate 20, the $2^{nd}$ area 20B of the substrate 20 includes three four-fin VFET structures 200B arranged in a row, and each of the four-fin VFET structures 200B is formed of four fin structures 210B-1, 210B-2, 210B-3 and 210B-4 surrounded by a connected gate structure 220B. Like the gate structure 220A in the $1^{st}$ area 20A, the connected gate structure 220B includes a gate dielectric layer 221B and a conductor layer 222B, and may be encapsulated by an encapsulation layer 212B formed of SiN or its equivalent. Above each of the fin structures 210B-1 to 210B-2 is a mask layer 211B used to protect each fin structure in an etching process applied to the initial substrate.

Two neighboring four-fin VFET structures 200B may be electrically isolated by an ILD 250B and an STI 260B. The ILD 250B and the STI 260B may each include SiO or its equivalent material like the ILD 250A and the STI 260A in the $1^{st}$ area 20A of the substrate 20. However, no ILD and STI such as the ILD 250B and the STI 260B are formed between the four fin structures 210B-1 to 210B-4 within each of the four-fin VFET structures 200B. Instead, the gate dielectric layer 221B and the conductor layer 222B forming the connected gate structure 220B may be filled in spaces between the four fin VFET structures 210B-1 to 210B-4 to increase a drive current of each of the four-fin VFET structures 200B.

Each of the fin structures 210B-1 to 210B-4 may have the same general structure and materials as the fin structure 210A of the single-fin VFET structure 200A. Thus, the descriptions thereof are omitted herein.

It is noted here that the three sets of fin structures 210B-1 to 210B-4 may be patterned along with the six fin structures 210A on the same substrate 20 to form a single IC chip at the same time by the same process, that is, the SAQP described above. These three sets of fin structures 210B-1 to 210B-4 may be patterned using another three sets of mask structures, that is, one mandrel 205, two $1^{st}$ spacers 215-1 and four $2^{nd}$ spacers 215-2 disposed above the initial substrate in the $2^{nd}$ area 20B with the same predetermined interval L2, which is used to dispose these mask structures above the initial substrate in the $1^{st}$ area 20A to form the fin structures 210A. Thus, like in the $1^{st}$ area 20A, a total of twelve $2^{nd}$ spacers 215-2 are disposed above the initial substrate in the $2^{nd}$ area 20B. However, in the $2^{nd}$ area 20B, all of the twelve $2^{nd}$ spacers 215-2 shown in FIG. 2B, that is, three sets of neighboring four $2^{nd}$ spacers 215-2, are used as respective masks to form twelve fin structures, that is, the three sets of neighboring four fin structures 210B-1 to 210B-4 for the three four-fin VFETs 200B. It is noted that the three sets of 2nd spacers 215-2 are disposed considering that no ILD structure is to be formed between the three sets of neighboring four fin structures 210B-1 to 210B-4, as described above. Between the four-fin VFETs 200B, the ILD 250B may be formed.

Also, as in the $1^{st}$ area 20A, the $2^{nd}$ spacer 215-2 is used as a mask to pattern each of the fin structures 210B-1 to 210B-4 therebelow, a width of the $2^{nd}$ spacer 215-2 may be the same as a width of each of the fin structures 210B-1 to 210B-4. However, after the fin structures 210A and 210B-1 to 210B-4 of the VFET device are formed using the SAQP as shown in FIG. 2A, the fin structures 210B-1 to 210B-4 of each four-fin VFET 200B may be trimmed in their horizontal widths to tune a threshold voltage of the connected gate structure 220B in view of a threshold voltage of the gate structure 220A of the fin structures 210A of the single-fin VFET structures 200A during a replacement metal gate (RMG) process, according to an embodiment. Thus, the horizontal width of each of the fin structures 210B-1 to 210B-4 may be smaller than that of each of the fin structures 210A formed on the same substrate 20.

Further, after the fin structures 210A and 210B-1 to 210B-4 are formed on the substrate 20 in the above manner, source/drain regions may be formed above and below of these fin structures to complete a VFET device on a single IC chip.

Figure 2B:
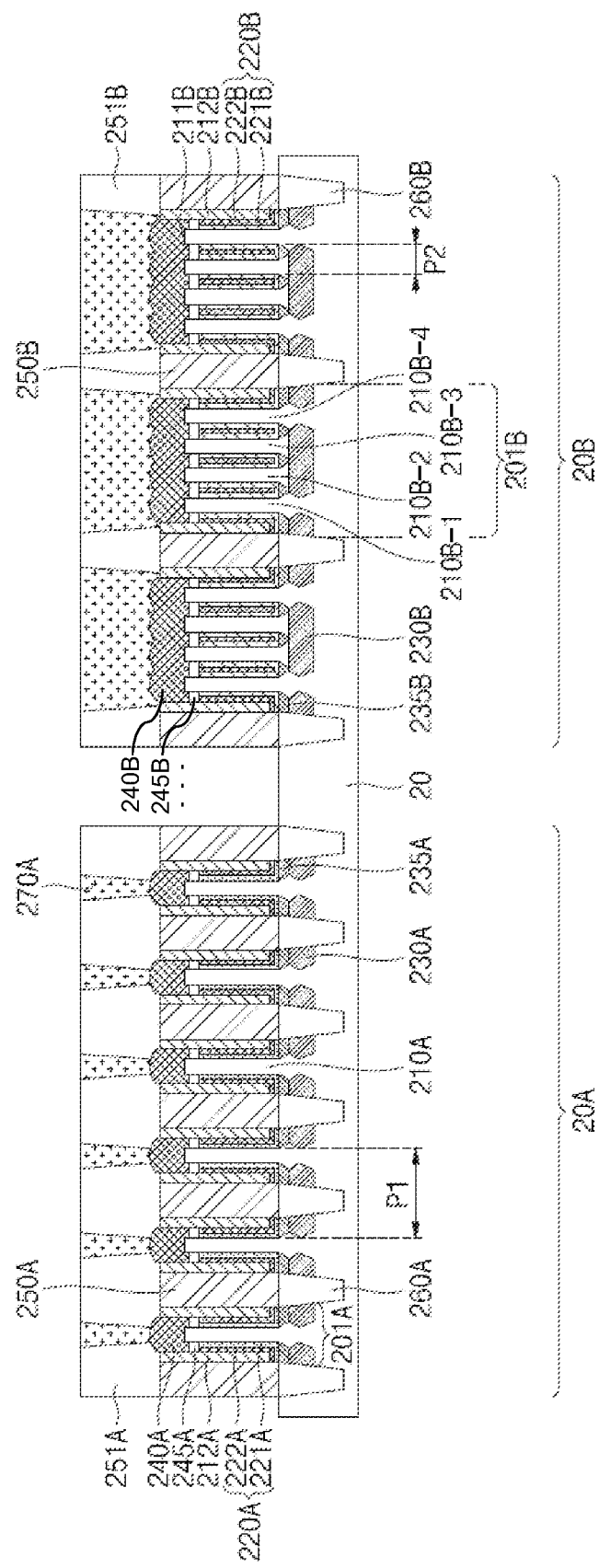
FIG. 2B illustrates a cross-section view of a structure of a VFET device in which an intermediate structure of the VFET device of FIG. 2A is completed on a substrate, according to an embodiment.

FIG. 2B illustrates a cross-section view of a structure of a VFET device in which an intermediate structure of the VFET device of FIG. 2A is completed on a substrate, according to an embodiment. For drawing brevity, some of the reference numbers used in FIG. 2A are not shown in FIG. 2B when they indicate same elements in both FIGS. 2A and 2B.

Referring to FIG. 2B, a bottom source/drain region 230A and a top source/drain region 240A are formed below and above the gate structure 220A of each single-fin VFET structure 200A in the $1^{st}$ area 20A of the substrate 20, thereby to firm each single-fin VFET 201A. The bottom source/drain region 230A may be epitaxially grown from the substrate 20 to be doped with one or more dopants such as boron (B) for a p-channel VFET and phosphorous (P) for a n-channel VFET, not being limited thereto. The top source/drain region 240A may be epitaxially grown from each fin structure 210A to be doped with the same one or more dopants in the bottom source/drain region 230A. On the top source/drain region 240A is disposed a top source/drain region contact structure (CA) 270A to connect the single-fin VFET 201A to a power source or another circuit element for internal routing. The top source/drain region contact structures 270A of the single-fin VFETs 201A are isolated from one another by an additional ILD 251A which may be formed of the same or similar material of the ILD 250A.

FIG. 2B further shows that a bottom spacer 235A is formed between each of the gate structures 220A and the bottom source/drain region 230A for insulation thereof, and a top spacer 245A is formed between each of the gate structures 220A and the top source/drain region 240A for insulation thereof. The bottom spacer 235A and the top spacer 245A may be formed of the same materials forming the bottom spacer 135A and the top spacer 145A, respectively.

In contrast, a plurality of four-fin VFETs 201B are formed in the $2^{nd}$ area 20B of the substrate 20 by forming differently-structured bottom source/drain regions and top source/drain regions as shown in FIG. 2B.

Each of the four-fin VFETs 201B includes a common bottom source/drain region 230B and a plurality of bottom spacers 235B, and a common top source/drain region 240B and a plurality of top spacers 245B. The common top source/drain region 240B may be connected to a power source or another circuit element for internal routing through a top source/drain region contact structure (CA) 270B. The bottom source/drain region 230B, the bottom spacers 235B, the common top source/drain region 240B and the top spacers 245B are formed of the same materials forming the source/drain region 230A, the bottom spacer 235A, the top source/drain region 240A and the top spacer 245A in the $1^{st}$ area 20A of the substrate 20, and thus, duplicate descriptions are omitted herein.

It is noted here that, compared to the two-fin VFET 101B of FIG. 1B and the single-fin VFET 201A, the four-fin VFET 201B may drive more currents to improve the device performance because the four-fin VFET 201B has more fin structures, i.e., four fin structures 210B-1 to 210B-4, than the two-fin VFET 101B and the single-fin VFET 201A. Further, the connected gate structure 220B is filled in spaces between the fin structures 210B-1 to 210B-3, and the connected gate structure 220B surrounding each of the four fin structures 210B-1 to 210B-4 are connected through a gate connection pattern (PB) in the front-end-of-line (FEOL) of the VFET device, which also contribute to driving more currents Despite the performance gain described above, the $2n^d$ area 20B of the substrate 20 shown in FIGS. 2A and 2B where the three four-fin VFETs 201B are formed has the same or substantially same size as the $2^{nd}$ area 10B of the substrate 10 shown in FIGS. 1A and 1B. In other words, the three four-fin VFETs 201B having a superior performance may be formed in the same or substantially same size of area where three two-fin VFETs 101B are formed, according to the present embodiment. This is at least because the four fin structures 210B-1 to 210B-4 of the four-fin VFET 201B according to the present embodiment are not isolated from one another by an ILD such as the ILD 150B disposed between the fin structures 110B-1 and 110B-2 of the two-fin VFET 101B as shown in FIG. 1B. As the four-fin VFET 201B is formed without an ILD isolating the fin structures 210B-1 to 210B-4 from one another, the four-fin VFET 201B can have a fin pitch P2 which is smaller than the fin pitch P1 of the two-fin VFET 101B shown in FIG. 1B. Thus, the VFET device of the present embodiment is also characterized in that the six single-fin VFETs 201A having a large fin pitch P1 and the three four-fin VFETs 201B having a small fin pitch P2 are formed on a single IC chip.

It is also noted that both the single-fin VFETs 201A and the four-fin VFETs 201B may be formed on a single IC chip using the SAQP at the same time to save manufacturing costs. In other words, the fin structures of the single-fin VFETs 201A and the four-fin VFETs 201B are formed not using different patterning methods, for example, single exposure patterning and SAQP, or SADP and SAQP, respectively, at different times.

As described above, the embodiment of the four-fin VFETs 201B shown in FIG. 2B enables improved device performance compared to the two-fin VFETs 101B described in reference to FIG. 1B even if they are formed on the same or substantially same size of substrate. This is at least because an ILD formed between fin structures of a multi-fin VFET is removed, and instead, an additional conductor layer including a work-function metal(s) is filled in the spaces between the fin structures.

However, the inventive concept is not limited to the foregoing embodiment. According to another embodiment, more than three two-fin VFET structures, in which neighboring two fin structures are not isolated by an ILD may be formed on the same size of area where only three two-fin VFET structures 100B isolated by the ILD are formed as shown in FIG. 1A, thereby achieving a device area gain.

Figure 3:
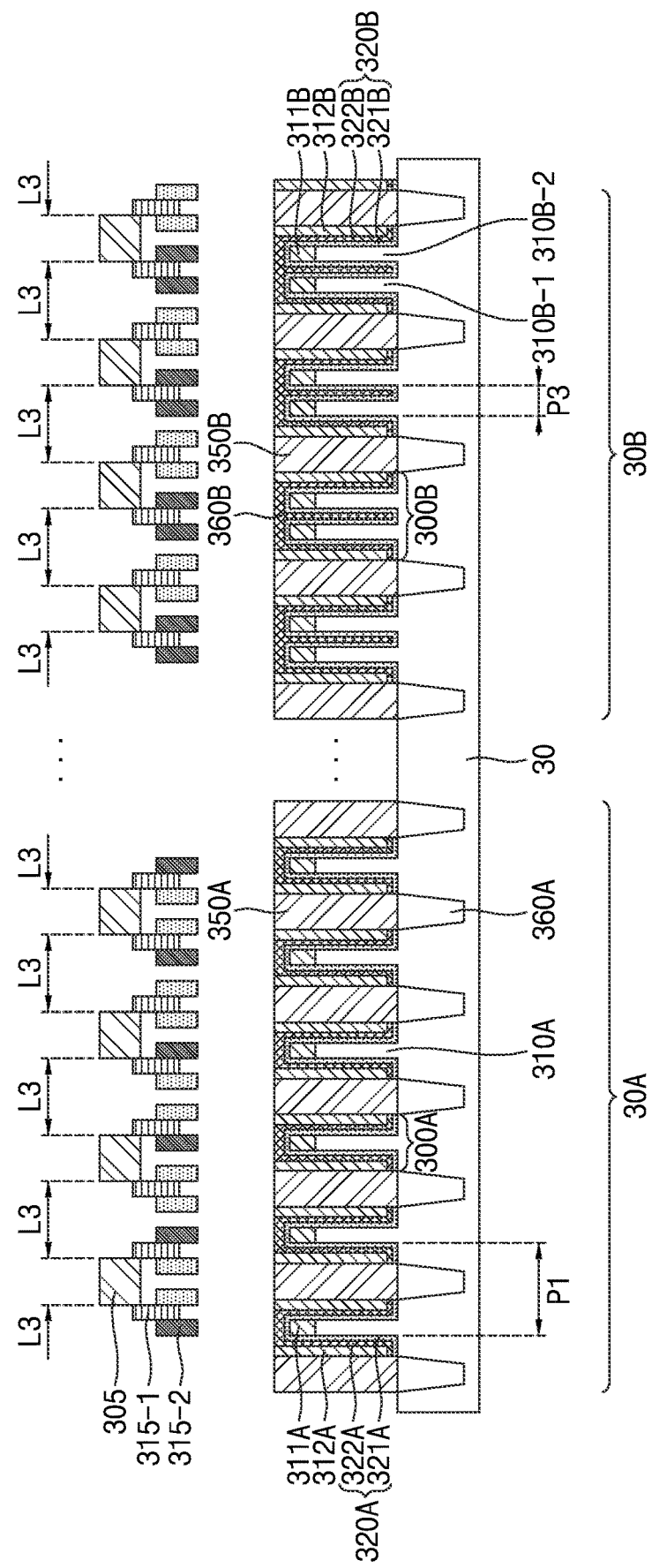
FIG. 3 illustrates a cross-section view of an intermediate structure of a VFET device which includes a plurality of single-fin VFET structures and a plurality of two-fin VFET structures are formed on a substrate, according to an embodiment.

FIG. 3 illustrates a cross-section view of an intermediate structure of a VFET device which includes a plurality of single-fin VFET structures and a plurality of two-fin VFET structures are formed on a substrate, according to an embodiment.

Referring to FIG. 3, a plurality of single-fin VFET structures 300A and a plurality of two-fin VFET structures 300B are provided on a substrate 30 of a single IC chip. In FIG. 3, six single-fin VFET structures 300A are formed on a $1^{st}$ area 30A of the substrate 30, and four two-fin VFET structures 300B are formed on a $2^{nd}$ area 30B of the substrate 30. Although FIG. 3 shows that the $1^{st}$ area 30A and the $2^{nd}$ area 30B respectively include only six single-fin VFET structures and four two-fin V VFET structures FETs, more or less number of single-fin VFET structures and two-fin VFET structures may be formed on the $1^{st}$ area 30A and the $2^{nd}$ area 30B, respectively, according to embodiments. The substrate 30 may also include other areas where one or more single-fin VFET structures, one or more two-fin VFET structures, and/or the four-fin VFET structures 200B shown in FIG. 2A are formed.

The structure and materials of the single-fin VFET structures 300A are the same as those of the single-fin VFET structures 100A in FIG. 1A and the single-fin VFET structures 200A in FIG. 2A. For example, the substrate 30, each fin structure 310A, a gate structure 320A including a gate dielectric layer 321A and a conductor layer 322A, a mask layer 311A, an encapsulation layer 312A, an ILD 350A and an STI 360A are the same as the substrate 20, the fin structure 210A, the gate structure 220A including the gate dielectric layer 221A and the conductor layer 222A, the mask layer 211A, the encapsulation layer 212A, the ILD 250A and the STI 260A shown in FIG. 2A, respectively. Thus, duplicate descriptions thereof are omitted herein.

However, a method of forming the six single-fin VFET structures 300A in the $1^{st}$ area 30A of the substrate 30 may be different from that of forming the single-fin VFET structures 200A in the $1^{st}$ area 20A of the substrate 20 shown in FIG. 2A.

While the six fin structures 210A of the six single-fin VFET structures 200A shown in FIG. 2A are formed by SAQP using three sets of one mandrel 205, two $1^{st}$ spacers 215-1 and four $2^{nd}$ spacers 215-2 on the initial substrate of the substrate 20, the six fin structures 310A of the six single-fin VFET structures 300A may be formed by SAQP using four sets of one mandrel 305, two $1^{st}$ spacers 315-1 and four $2^{nd}$ spacers 315-2, according to an embodiment. That is, one more set of a mandrel, two $1^{st}$ spacers and four spacers is used for the present SAQP. The SAQP used herein may be ArF-i SAQP.

FIG. 3 shows where the mandrels 305 and the spacers 315-1 and 315-2 are positioned above the VFET structures 300A and 300B with respect to the fin structures to be formed therebelow to illustrate how each of these fin structures is patterned through the SAQP using these mask structures. All of the mandrels 305 and the spacers 315-1 and 315-2 as well as the mask layer 311A would also be removed after patterning the fin structures of the VFET structures 300A and 300B like the mandrels 205, the spacers 215-1 and 215-2 and the mask layer 211A of FIG. 2A.

In order to pattern the six fin structures 310A from the initial substrate through the SAQP, four mandrels 305 may be formed in a row above the initial substrate with a predetermined interval L3 therebetween, and two $1^{st}$ spacers 315-1 may be deposited on sidewalls of each mandrel 305. The mandrels 305 may be removed by, for example, dry etching, leaving only the $1^{st}$ spacers 315-1 above the initial substrate. Two $2^{nd}$ spacers 315-2 may be deposited on sidewalls of each of the eight $1^{st}$ spacers 315-1, and the $1^{st}$ spacers 315-1 are removed by the same or similar method of removing the mandrels 305. Thus, FIG. 3A shows that a total of sixteen $2^{nd}$ spacers 315-2 are deposited above the substrate 30 at the $1^{st}$ area 30A.

The initial substrate may be etched using the sixteen $2^{nd}$ spacers 315-2 as respective masks to form sixteen fin structures therebelow, and ten $2^{nd}$ spacers 315-2, except selected six $2^{nd}$ spacers 315-2 below which the six fin structures 310A are to be formed, are removed to etch out ten fin structures formed therebelow, leaving only the six fin structures 310A in the $1^{st}$ area 30A of the substrate 30 as shown in FIG. 3A. Alternatively, the initial substrate may be etched using only six $2^{nd}$ spacers selected from among the sixteen $2^{nd}$ spacers 315-2, positioned where the six fin structures 310A are to be formed, as masks to pattern the six fin structures 310A by first removing the non-selected ten $2^{nd}$ spacers 315-2, and then using the selected six $2^{nd}$ spacers 315-2 as respective masks to pattern the six fin structures 210A. Below the removed ten $2^{nd}$ spacers 315-2 in the $1^{st}$ area 30A, the ILDs 350A may be formed. In the present embodiment, the mandrels 305, the $1^{st}$ spacers 315-1 and the $2^{nd}$ spacers 315-2 for the SAQP may be arranged above the initial substrate such that the selected $2^{nd}$ spacers 315-2 are disposed at positions where the fin structures 310A for the single-fin VFET structures 300A are to be formed from the $1^{st}$ area 30A of the initial substrate therebelow, respectively. Since the $2^{nd}$ spacer 315-2 is used as a mask to pattern the fin structure 310A therebelow, a width of the $2^{nd}$ spacer 315-2 may be the same as a width of the fin structure 310A.

It is noted here that the six fin structures 310A of the single-fin VFETs 300A are patterned by the SAQP using four sets of one mandrel 305, two $1^{st}$ spacers 315-1 and four $2^{nd}$ spacers 315-2 with the predetermined interval L3, while the same six fin structures 210A of the single-fin VFET structures 200A, which are the same as the fin structures 310A, are patterned by the SAQP using only three sets of one mandrel 205, two $1^{st}$ spacers 215-1 and four $2^{nd}$ spacers 215-2 as shown in FIG. 2A. In other words, the fin structures 310A of the single-fin VFET structures 300A are formed using one more set of one mandrel, two $1^{st}$ spacers and four $2^{nd}$ spacers than the fin structures 210A of the single-fin VFET structures 200A. One reason for nevertheless using the SAQP using more mask structures, that is, mandrels and spacers, to pattern the fin structures 310A of the single-fin VFET structures 300A is that fin structures of the two-fin VFET structures 300B will also be patterned on the same substrate 30 to form a single IC chip, where the fin structures 310A of the single-fin VFET structures 300A are formed, using the mask structures disposed at the same predetermined interval L3 above the initial substrate. It is noted that applying SAQP using mask structures disposed at the same predetermined interval L3 above an initial substrate to formation of fin structures of single-fin VFET structures as well as fin structures of multi-fin VFET structures on the same substrate 30 at a same time costs less than applying different SAQPs using mask layers disposed at different intervals to formation of the fin structures of the single-fin VFETs and formation of the fin structure of the multi-fin VFETs on the same substrate 30 at different times.

The mandrels 305 and the spacers 315-1 and 315-2 may include the same materials forming the mandrels 205 and the spacers 215-1 and 215-2, and thus, descriptions thereof are omitted herein.

In contrast with the $1^{st}$ area 30A of the substrate 30, the $2^{nd}$ area 30B of the substrate 30 includes four two-fin VFET structures 300B arranged in a row, and each of the two-fin VFET structures 300B is formed of two fin structures 310B-1 and 310B-2 surrounded by a connected gate structure 320B. Like the gate structure 320A in the $1^{st}$ area 30A, the connected gate structure 320B includes a gate dielectric layer 321B and a conductor layer 322B, and may be encapsulated by an encapsulation layer 312B. Above each of the fin structures 310B-1 and 310B-2 is a mask layer 311B used to protect each fin structure in an etching process applied to the initial substrate.

Two neighboring two-fin VFET structures 300B may be electrically isolated by an ILD 350B and an STI 360B. The ILD 350B and the STI 360B may each include SiO or its equivalent material like the ILD 350A and the STI 360A in the $1^{st}$ area 30A of the substrate 30. However, no ILD and STI such as the ILD 350B and the STI 360B are formed between the two fin structures 310B-1 and 310B-2 within each of the two-fin VFET structures 300B in the $2^{nd}$ area 30B of the substrate 30. Instead, the gate dielectric layer 321B and the conductor layer 322B forming the connected gate structure 320B may be filled in spaces between the two fin structures 310B-1 and 310B-2 to increase a drive current of each of the two-fin VFET structures 300B.

It is noted here that the $2^{nd}$ area 30B of the substrate 30 where the four two-fin VFET structures 300B are formed has the same or substantially same size as the $2^{nd}$ area 10B of the substrate 10 where only three two-fin VFET structures 100B are formed as shown in FIG. 1A. In other words, more two-fin VFET structures 300B may be formed in the same or substantially same size of area according to the present embodiment compared to the previous embodiment of FIG. 1A. This is at least because the two fin structures 310B-1 and 310B-2 of the two-fin VFET structure 300B are not isolated by an ILD such as the ILD 150B isolating the fin structures 110B-1 and 110B-2 of the single-fin VFET structure 100B shown in FIG. 1A. As the two-fin VFET structure 300B is formed without an ILD isolating the fin structures 310B-1 and 310B-2 from each other, the two-fin VFET structure 300B can have a fin pitch P3 which is smaller than the fin pitch P1 of the two-fin VFET structure 100B shown in FIG. 1A. Thus, the VFET device of the present embodiment is also characterized in that the six single-fin VFET structures 300A having a large fin pitch P1 and the four two-fin VFET structures 300B having a small fin pitch P3 are formed on a single IC chip Each of the fin structures 310B-1 and 310B-2 may have the same structure and materials as the fin structure 310A of the single-fin VFET structures 300A. Thus, the descriptions thereof are omitted herein.

It is noted here that the four sets of fin structures 310B-1 and 310B-2 may be patterned along with the six fin structures 310A on the same substrate 30 to form a single IC chip at the same time by the same process, that is, the SAQP described above. These four sets of fin structures 310B-1 and 310B-2 may be patterned using another four sets of mask structures, that is, one mandrel 305, two $1^{st}$ spacers 315-1 and four $2^{nd}$ spacers 315-2 disposed above the initial substrate in the $2^{nd}$ area 30B with the same predetermined interval L3, which is used to dispose these mask structures above the initial substrate in the $1^{st}$ area 30A to form the fin structures 310A. Thus, like in the $1^{st}$ area 30A, a total of sixteen $2^{nd}$ spacers 315-2 are shown above the substrate 30 at the $2^{nd}$ area 30B in FIG. 3.

As in the $1^{st}$ area 30A, sixteen fin structures may be formed in the $2^{nd}$ area 30B using the same number of $2^{nd}$ spacers 315-2 at the same time. Then, except four sets of neighboring two fin structures 310B-1 and 310B-2 formed below four sets of neighboring two $2^{nd}$ spacers 315-2 selected from among the sixteen $2^{nd}$ spacers 315-2, eight fin structures formed below the non-selected eight $2^{nd}$ spacers 315-2 are etched out after removing the non-selected eight $2^{nd}$ spacers 315-2. Alternatively, when only six fin structures 310A are formed using selected six $2^{nd}$ spacers 315-2 in the $1^{st}$ area 30A, only four sets of the neighboring two fin structures 310B-1 and 310B-2 may be formed in the $2^{nd}$ area 30B using the selected four sets of neighboring two $2^{nd}$ spacers 315-2 after removing the non-selected eight $2^{nd}$ spacers 315-2. However, it is noted that, in either case, the four sets of $2^{nd}$ spacers 315-2 are selected considering that no ILD structure is to be formed between the neighboring two fin structures 310B-1 and 310B-2, as described above. Below the removed eight $2^{nd}$ spacers 315-2 in the $2^{nd}$ area 30B, the ILD s 350B may be formed.

Also, as in the $1^{st}$ area 30A, the $2^{nd}$ spacer 315-2 is used as a mask to pattern each of the fin structures 310B-1 and 310B-2 therebelow, a width of the $2^{nd}$ spacer 315-2 may be the same as a width of each of the fin structures 310B-1 and 310B-2. However, after the fin structures 310A, 310B-1 and 310B-2 of the VFET device are formed using the SAQP as shown in FIG. 3, the fin structures 310B-1 and 310B-2 of each two-fin VFET 300B may be trimmed in their horizontal widths to tune a threshold voltage of the connected gate structure 320B in view of a threshold voltage of the gate structure 320A of the fin structures 310A of the single-fin VFET structures 300A during an RMG process, according to an embodiment. Thus, the horizontal width of each of the fin structures 310B-1 and 310B-2 may be smaller than that of each of the fin structures 310A formed on the same substrate 30.

According to the above embodiment described in reference to FIG. 3, at least a device area gain may be obtained for a VFET device in comparison with the embodiment of FIG. 1A although both embodiments are directed to formation of a plurality of two-fin VFET structures along with a plurality of single-fin VFET structures on the same substrate to form a single IC chip. The present embodiment also enables the formation of both the single-fin VFET structures 300A and the two-fin VFET structures 300B on a same substrate by applying the SAQP at the same time to save manufacturing costs.

It is also noted that as the fin pitch is reduced by removing the ILD between the fin structures 210B-1 to 210B-4 in each of the four-fin VFET structures 200B and between the fin structures 310B-1 and 310B-2 in each of the two-fin VFET structures 300B, oxygen ingress by the ILD may be prevented, and an inversion oxide thickness ($T_{inv}$) may be scaled to achieve a more improved device performance.

Referring back to FIGS. 2A and 2B, the fin structures of the single-fin VFET structures 200A and the four-fin VFET structures 200B are formed applying the SAQP on the initial substrate. However, the same number of these fin structures having the same narrow fin pitches P1 and P2 as described in reference to FIGS. 2A and 2B may also be formed applying SADP or single-exposure pattering using extreme ultraviolet (EUV), according to embodiments.

Figure 4:
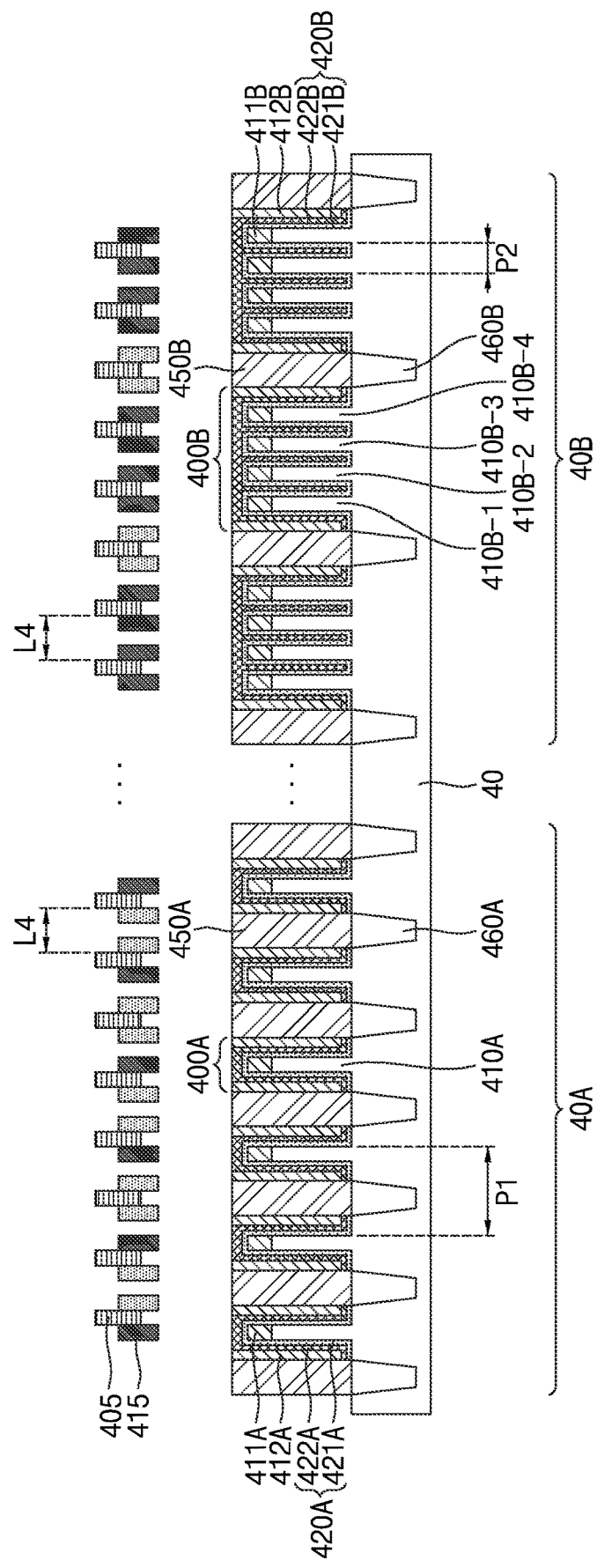
FIG. 4 illustrates a cross-section view of an intermediate structure of another VFET device which includes a plurality of single-fin VFET structures and a plurality of four-fin VFET structures are formed on a substrate, according to an embodiment.

For example, FIG. 4 shows that fin structures 410A of a plurality of single-fin VFET structures 400A and fin structures 410B-1 to 410B-4 of each of a plurality of four-fin VFET structures 400B are formed by applying SADP to an initial substrate of a substrate 40 using a plurality of mask structures such as mandrels 405 and spacers 415.

In order to pattern the six fin structures 410A and three sets of four fin structures 410B-1 to 410B-4 from the initial substrate using the SADP, eight mandrels may be formed in a row with a predetermined distance L4 therebetween above the initial substrate in each of a area 40A and a $2^{nd}$ area 40B, and two spacers 415 may be formed at opposite sidewall of each of the mandrels 405. Thus, a total of sixteen spacers 415 may be disposed above the initial substrate in each of the $1^{st}$ area 40A and the $2^{nd}$ area 40B. After the mandrels 405 are removed, sixteen fin structures may be formed using the sixteen spacers 415 as respective masks in each of the $1^{st}$ area 40A and the $2^{nd}$ area 40B. In the $1^{st}$ area 40A, ten spacers 415, other than six spacers 415 selected from among the sixteen spacers 415, are removed, and the fin structures formed therebelow are etched out to leave only the six fin structures 410A on the substrate 40. In the $2^{nd}$ area 40B, four spacers 415, other than three sets of four neighboring spacers 415, are removed, and the fin structures formed therebelow are etched out to leave the three sets of four fin structures 410B-1 to 410B-2 on the substrate 40. The structures and characteristics of the fin structures 410A and 410B-1 to 410B-4 are the same as the fin structures 210A and 210B-1 to 210B-4 shown in FIG. 2A, and thus, duplicate descriptions are omitted herein.

Figure 5:
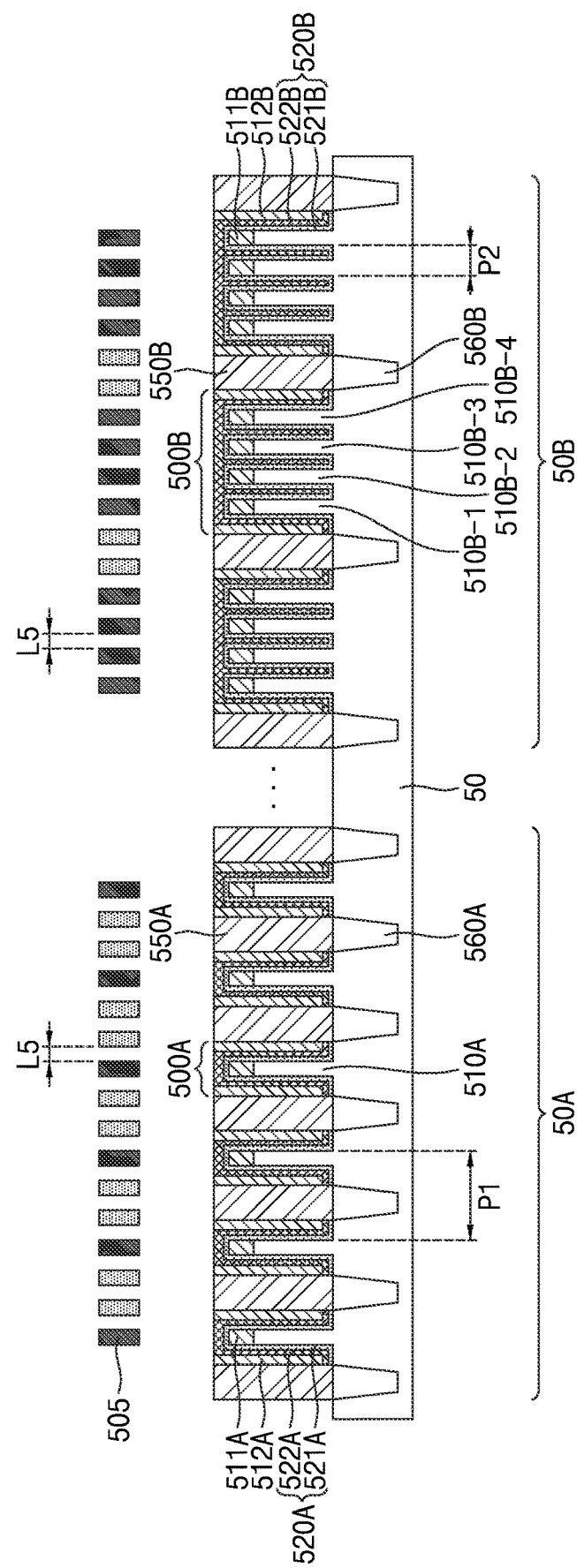
FIG. 5 illustrates a cross-section view of an intermediate structure of still another VFET device which includes a plurality of single-fin VFET structures and a plurality of four-fin VFET structures are formed on a substrate, according to an embodiment.

Further, FIG. 5 shows that fin structures 510A of a plurality of single-fin VFET structures 500A and fin structures 510B-1 to 510B-4 of each of a plurality of four-fin VFET structures 500B are formed by applying single-exposure patterning to an initial substrate of a substrate 50 using a plurality of mask structures which include only mandrels 505.

In order to pattern the six fin structures 510A and three sets of four fin structures 510B-1 to 510B-4 from the initial substrate using the single-exposure pattering, sixteen mandrels 505 may be formed in a row with a predetermined distance L5 therebetween above the initial substrate in each of a $1^{st}$ area 50A and a $2^{nd}$ area 50B. Sixteen fin structures may be formed using the sixteen mandrels 505 as respective masks in each of the $1^{st}$ area 50A and the $2^{nd}$ area 50B. In the $1^{st}$ area 50A, ten mandrels 505, other than six mandrels 505 selected from among the sixteen mandrels 505, are removed and the fin structures formed therebelow are etched out to leave only the six fin structures 510A on the substrate 50. In the $2^{nd}$ area 50B, four mandrels 505, other than three sets of four neighboring mandrels 505, are removed and the fin structures formed therebelow are etched out to leave the three sets of four fin structures 510B-1 to 510B-2 on the substrate 50. The structures and characteristics of the fin structures 510A and 510B-1 to 510B-4 are the same as the fin structures 210A and 210B-1 to 210B-4 shown in FIG. 2A, and thus, duplicate descriptions are omitted herein.

It is also noted that VFET devices shown in FIGS. 4 and 5 have the same or similar advantages including the smaller fin pitch P2 and an improved device performance as the VFET device shown in FIGS. 2A and 2B, and thus, the descriptions thereof are also omitted.

Although not specifically shown in FIGS. 2A and 3-5, an ILD may be formed between a single-fin VFET and a neighboring multi-fin VFET formed on a same substrate to form a single IC chip to electrically disconnect the gate structure of the single-fin VFET and the connected gate structure of the neighboring multi-fin VFET.

Figure 6:
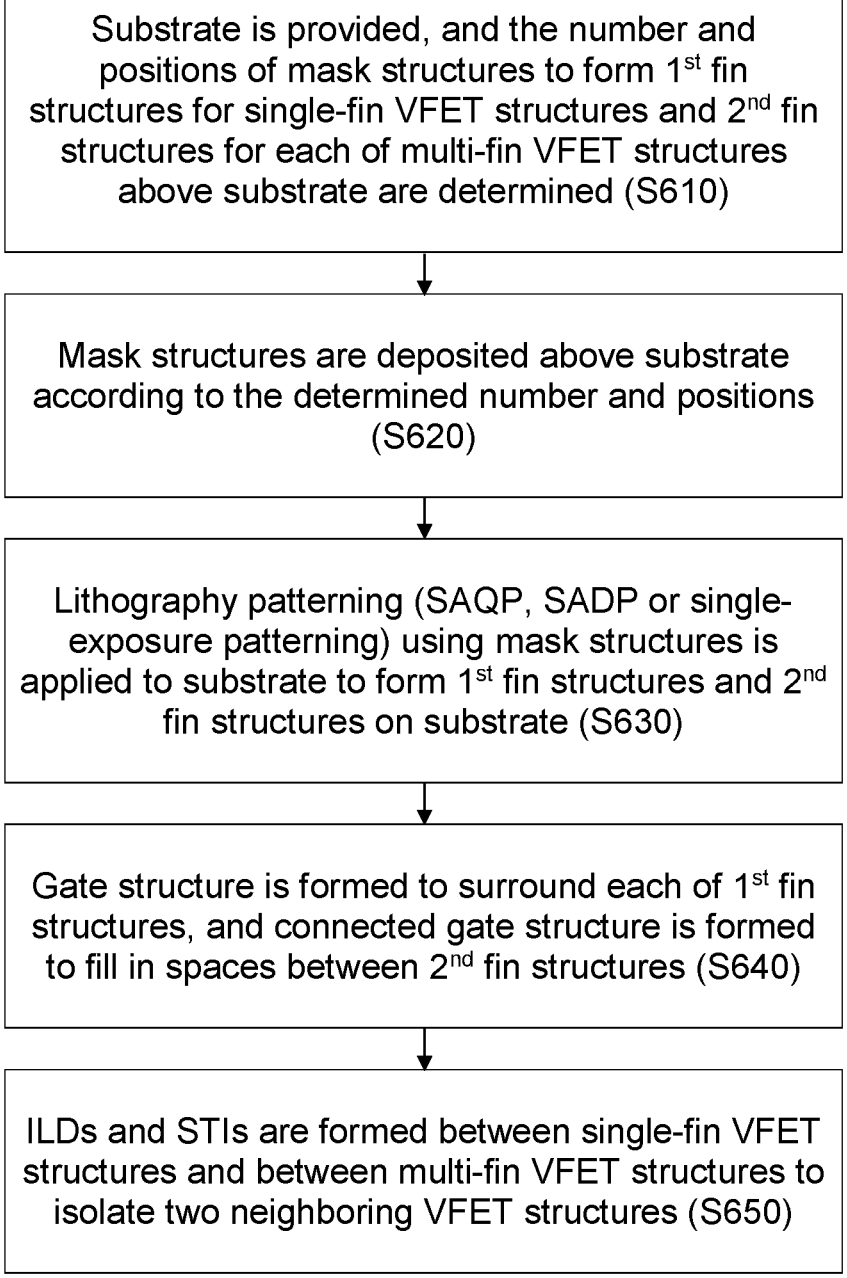
FIG. 6 illustrates a flowchart of forming fin structures for a VFET device including a plurality of single-fin VFET structures and a plurality of multi-fin VFET structures in reference to FIG. 2A, according to an embodiment.

FIG. 6 illustrates a flowchart of forming fin structures for a VFET device including a plurality of single-fin VFETs and a plurality of multi-fin VFETs in reference to FIG. 2A, according to an embodiment.

In operation 610, a substrate is provided, and the number and positions of mask structures (205, 215-1 and 215-2) to form $1^{st}$ fin structures (210A) for a plurality of single-fin VFET structures (200A) and $2^{nd}$ fin structures (210B-1 to 210B-4) for each of a plurality of multi-fin VFET structures (200B) above the substrate are determined.

In operation 620, the mask structures (205, 215-1 and 215-2) are deposited above the substrate according to the determined number and positions.

In operation 630, lithography patterning (SAQP, SADP or single-exposure patterning) using the deposited mask structures is applied to the substrate to form the $1^{st}$ fin structures (210A) and the $2^{nd}$ fin structures (210B-1 to 210B-4) on the substrate.

Here, the mask structures may include a plurality of mandrels (205), a plurality of $1^{st}$ spacers (215-1) and/or a plurality of $2^{nd}$ spacers (215-2) depending on a lithography patterning method selected among SAQP, SADP and single-exposure patterning. In case of the SAQP, these mask structures may be arranged above the substrate such that the $2^{nd}$ spacers (215-2) are disposed at positions where the $1^{st}$ fin structures (210A) and the $2^{nd}$ fin structures (210B-1 to 210B-4) are to be formed from the substrate therebelow, according to an embodiment. These mask structures may also be arranged to a predetermined interval (L2) therebetween. Moreover, the lithography patterning may be performed considering that there is no space for an ILD between the $2^{nd}$ fin structures (210B-1 to 210B-4) to be patterned, and instead, a connected gate structure (220B) is formed to fill in spaces between these fin structures, according to an embodiment. This is because the ILD isolating two neighboring fin structures may not be necessary in forming a multi-fin VFET structure having the connected gate structure according to the present embodiment, as described above in reference with FIG. 2A.

In operation 640, a gate structure (220A) is formed to surround each of the $1^{st}$ fin structures (210A), and a connected gate structure (220B) is formed to fill in spaces between the $2^{nd}$ fin structures (210B-1 to 210B-4).

In operation 450, ILDs (250A and 250B) and STIs (260A and 260B) are formed between the single-fin VFET structures (200A) and between the multi-fin VFET structures (200B), respectively, to isolate two neighboring VFET structures. However, these ILDs or STIs may be formed before the fin structures of the VFET structures are formed according to embodiments.

It is noted here that the lithography patterning selected among SAQP, SADP and single-exposure patterning may be applied to form the $1^{st}$ fin structures (210A) of the single-fin VFETs (200A) as well as the $2^{nd}$ fin structures (210B-1 to 210B-4) of the multi-fin VFETs (200B) on a same substrate to form a single IC chip at the same time.

The above method may also apply to forming the fin structures of 310A of the single-fin VFET structure 300A and the fin structures 310B1 and 310B2 of each of the two-fin VFET structures 300B shown in FIG. 3.

Figure 7:
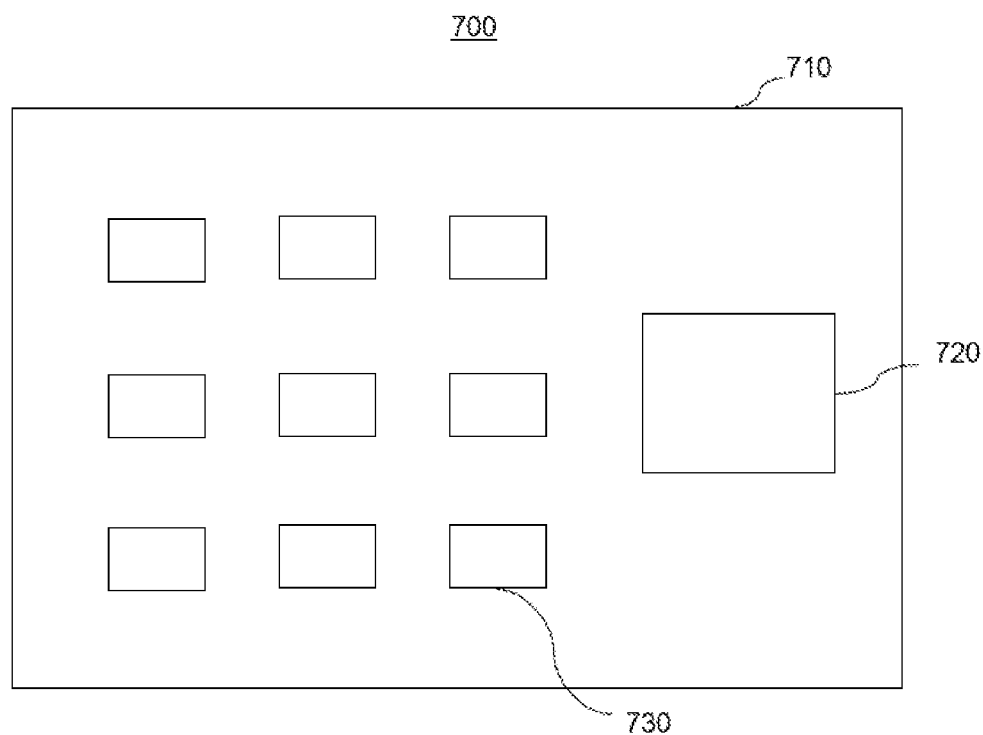
FIG. 7 illustrates a schematic plan view of a semiconductor module according to an embodiment.

FIG. 7 illustrates a schematic plan view of a semiconductor module according to an embodiment.

Referring to FIG. 7, a semiconductor module 700 according to an embodiment may include a processor 720 and semiconductor devices 730 that are mounted on a module substrate 710. The processor 720 and/or the semiconductor devices 730 may include one or more VFET devices described in the above embodiments.

Figure 8:
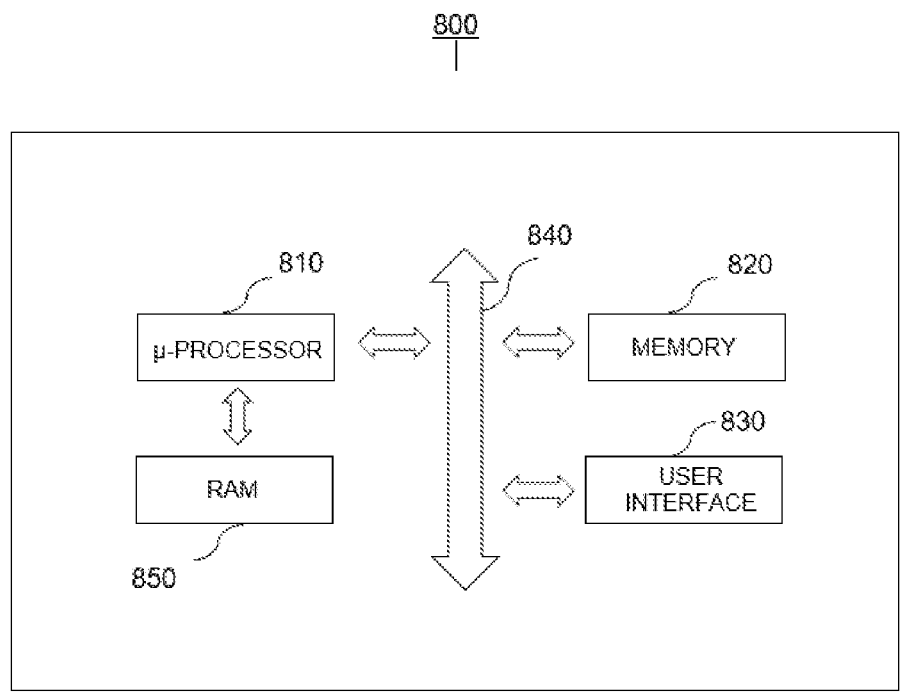
FIG. 8 illustrates a schematic block diagram of an electronic system according to an embodiment.

FIG. 8 illustrates a schematic block diagram of an electronic system according to an embodiment.

Referring to FIG. 8, an electronic system 800 in accordance with an embodiment may include a microprocessor 810, a memory 820, and a user interface 830 that perform data communication using a bus 840. The microprocessor 810 may include a central processing unit (CPU) or an application processor (AP). The electronic system 800 may further include a random access memory (RAM) 850 in direct communication with the microprocessor 810. The microprocessor 810 and/or the RAM 850 may be implemented in a single module or package. The user interface 830 may be used to input data to the electronic system 800, or output data from the electronic system 800. For example, the user interface 830 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 820 may store operational codes of the microprocessor 810, data processed by the microprocessor 810, or data received from an external device. The memory 820 may include a memory controller, a hard disk, or a solid state drive (SSD).

At least the microprocessor 810, the memory 820 and/or the RAM 850 in the electronic system 800 may include one or more VFET devices described in the above embodiments.

The foregoing is illustrative of example embodiments and is not to be construed as limiting thereof. Although a few example embodiments have been described, those skilled in the art will readily appreciate that many modifications are possible in the above embodiments without materially departing from the inventive concept.

What is claimed is:

1. A vertical field-effect transistor (VFET) device comprising:
   a substrate;
   at least one single-fin VFET formed on the substrate, and each of the at least one single-fin VFET comprising a fin structure and a gate structure surrounding the fin structure, the fin structure forming a channel for current flow in a vertical direction;
   a plurality of multi-fin VFETs formed on the same substrate, each of the plurality of multi-fin VFETs comprising a plurality of fin structures and a connected gate structure surrounding the fin structures; and
   a $1^{st}$ isolation structure between a single-fin VFET and a neighboring multi-fin VFET to electrically disconnect the gate structure of the single-fin VFET and the connected gate structure of the neighboring multi-fin VFET,
   wherein the connected gate structure is formed in a space between the neighboring two fin structures among the plurality of fin structures
   wherein a $2^{nd}$ isolation structure is formed between two neighboring multi-fin VFETs to electrically disconnect the connected gate structures of the two neighboring multi-fin VFETs from each other,
   wherein the fin structure of the at least one single-fin VFET, the plurality of fin structures of each of the multi-fin VFETs, and the 1stand 2nd'solation structures are extended in directions parallel to each other and a top surface of the substrate, perpendicular to a direction in which the plurality of fin structures are arranged.

2. The VFET device of claim 1, wherein no isolation structure is formed between the neighboring two fin structures of the multi-fin VFET to electrically disconnect the connected gate structure surrounding the neighboring two fin structures.

3. The VFET device of claim 2, wherein the VFET device is formed in a single integrated circuit (IC) chip.

4. The VFET device of claim 2, wherein the at least one single-fin VFET comprises a plurality of single-fin VFETs, wherein a $3^{rd}$ isolation structure is formed between two neighboring single-fin VFETs among the plurality of single-fin VFETs to electrically disconnect the gate structures of the two neighboring single-fin VFETs from each other.

5. A vertical field-effect transistor (VFET) device comprising:
   a substrate;
   at least one single-fin VFET formed on the substrate, and each of the at least one single-fin VFET comprising a fin structure and a gate structure surrounding the fin structure, the fin structure forming a channel for current flow in a vertical direction;
   at least one multi-fin VFET formed on the same substrate, each of the at least one multi-fin VFET comprising a plurality of fin structures and a connected gate structure surrounding the fin structures; and
   an isolation structure between a single-fin VFET and a neighboring multi-fin VFET to electrically disconnect the gate structure of the single-fin VFET and the connected gate structure of the neighboring multi-fin VFET,
   wherein the connected gate structure is formed in a space between the neighboring two fin structures among the plurality of fin structures, wherein a horizontal width of a fin structure of the multi-fin VFET is smaller than a horizontal width of the fin structure of the single-fin VFET.

6. The VFET device of claim 5, wherein a gate threshold voltage of the multi-fin VFETs is tuned based on a gate threshold voltage of the single-fin VFET.

7. The VFET device of claim 1, wherein the connected gate structure surrounds the fin structures of the multi-fin VFET by being connected through a gate connection pattern (PB) in a front-end-of-line (FEOL) of the VFET device.

* * * * *